(12) United States Patent
Kueffner et al.

(10) Patent No.: US 11,274,034 B2
(45) Date of Patent: Mar. 15, 2022

(54) ACOUSTIC RELIEF IN MEMS

(71) Applicant: Knowles Electronics, LLC, Itasca, IL (US)

(72) Inventors: Alyssa Kueffner, Itasca, IL (US); Sung Bok Lee, Chicago, IL (US); Yenhao Chen, Itasca, IL (US); Yaoyang Guo, Itasca, IL (US); Jeremy Hui, Itasca, IL (US); John J. Albers, Chicago, IL (US); Jonathan Reeg, Itasca, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 0 days.

(21) Appl. No.: 16/626,656

(22) PCT Filed: Jul. 26, 2018

(86) PCT No.: PCT/US2018/043799
§ 371 (c)(1),
(2) Date: Dec. 26, 2019

(87) PCT Pub. No.: WO2019/023409
PCT Pub. Date: Jan. 31, 2019

(65) Prior Publication Data
US 2020/0255284 A1 Aug. 13, 2020

Related U.S. Application Data

(60) Provisional application No. 62/537,240, filed on Jul. 26, 2017.

(51) Int. Cl.
*B81B 3/00* (2006.01)
*H04R 1/04* (2006.01)
(Continued)

(52) U.S. Cl.
CPC ............ *B81B 3/0021* (2013.01); *H04R 1/04* (2013.01); *H04R 19/005* (2013.01); *H04R 19/04* (2013.01);
(Continued)

(58) Field of Classification Search
None
See application file for complete search history.

(56) References Cited

U.S. PATENT DOCUMENTS 7,190,038 B2 3/2007 Dehe et al.
7,473,572 B2 1/2009 Dehe et al.
(Continued)

FOREIGN PATENT DOCUMENTS

CN 103917483 A 7/2014
CN 104125531 A 10/2014
(Continued)

OTHER PUBLICATIONS

International Search Report and Written Opinion, PCT/US2018/043799, Knowles Electronics, LLC (dated Dec. 28, 2018).

*Primary Examiner* — Paul W Huber
(74) *Attorney, Agent, or Firm* — Foley & Lardner LLP

(57) ABSTRACT

A microelectromechanical system (MEMS) motor includes a substrate, a backplate, and a diaphragm. The substrate has a first surface and a second surface. The second surface has a slot that extends at least partially into the substrate. A port extends through the substrate. The backplate is mounted to the first surface of the substrate, and the backplate covers at least a portion of the port. The diaphragm is between the backplate and the substrate. The diaphragm moves with respect to the backplate in response to acoustic energy that passes through the port.

7 Claims, 16 Drawing Sheets

(51) Int. Cl.
  *H04R 19/00* (2006.01)
  *H04R 19/04* (2006.01)
  *H04R 31/00* (2006.01)

(52) U.S. Cl.
  CPC ...... *H04R 31/00* (2013.01); *B81B 2201/0257* (2013.01); *B81B 2203/0127* (2013.01); *H04R 2201/003* (2013.01)

(56) References Cited

U.S. PATENT DOCUMENTS

| | | | |
|---|---|---|---|
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 8,494,577 B2 * | 7/2013 | Shiogama | H04M 1/035 455/550.1 |
| 8,618,619 B1 * | 12/2013 | Miks | H04R 1/021 257/414 |
| 2005/0207605 A1 | 9/2005 | Dehe et al. | |
| 2006/0237806 A1 * | 10/2006 | Martin | B81C 1/00182 257/415 |
| 2007/0278501 A1 | 12/2007 | MacPherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2011/0272769 A1 * | 11/2011 | Song | H04R 31/00 257/416 |
| 2013/0075836 A1 | 3/2013 | Lee | |
| 2013/0343564 A1 * | 12/2013 | Darlington | H04R 1/1083 381/74 |
| 2014/0037115 A1 | 2/2014 | Vos et al. | |
| 2014/0084396 A1 | 3/2014 | Jenkins et al. | |
| 2014/0103460 A1 | 4/2014 | Dehe et al. | |
| 2014/0321687 A1 | 10/2014 | Friel et al. | |
| 2015/0014796 A1 | 1/2015 | Dehe | |
| 2015/0296306 A1 | 10/2015 | Shao et al. | |
| 2017/0041692 A1 * | 2/2017 | Watson | H04R 19/04 |
| 2017/0150248 A1 * | 5/2017 | Littrell | H04R 1/083 |
| 2017/0374441 A1 * | 12/2017 | Hoekstra | B81C 1/00309 |
| 2017/0374442 A1 * | 12/2017 | Pennock | H04R 19/005 |
| 2018/0215609 A1 * | 8/2018 | Agashe | B81C 1/00285 |

FOREIGN PATENT DOCUMENTS

| | | |
|---|---|---|
| CN | 104284290 A | 1/2015 |
| CN | 106132869 A | 11/2016 |
| CN | 106331967 A | 1/2017 |
| GB | 2 538 432 A | 11/2016 |

* cited by examiner

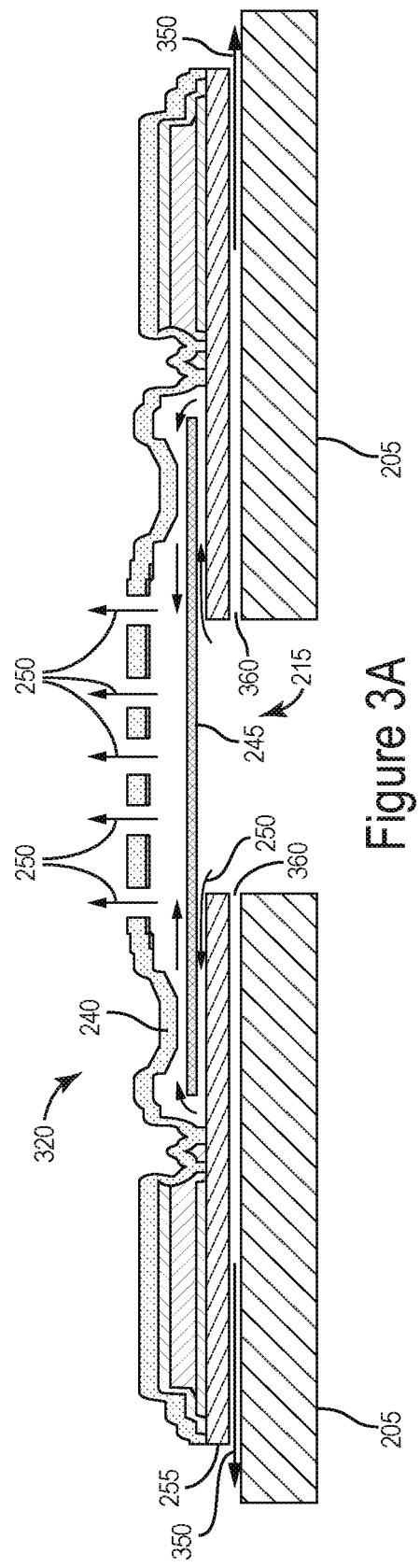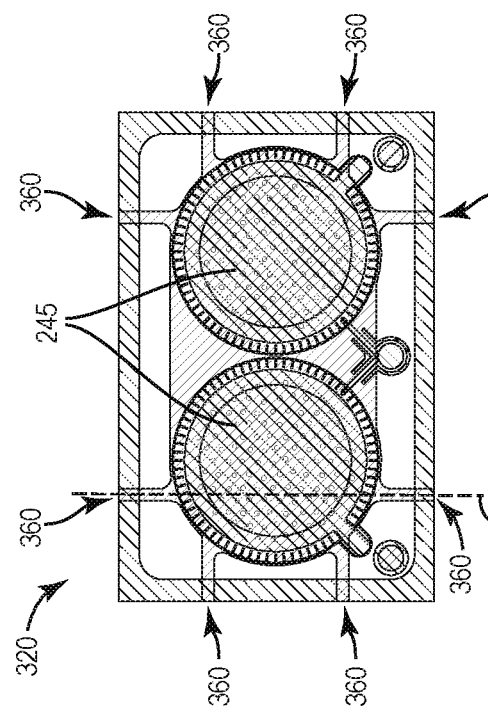

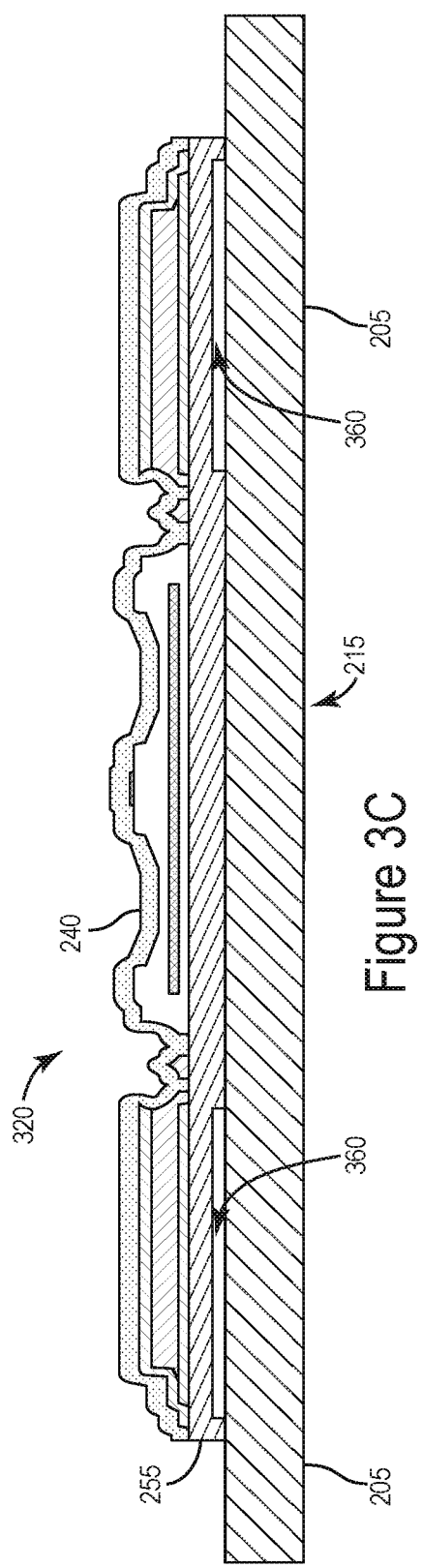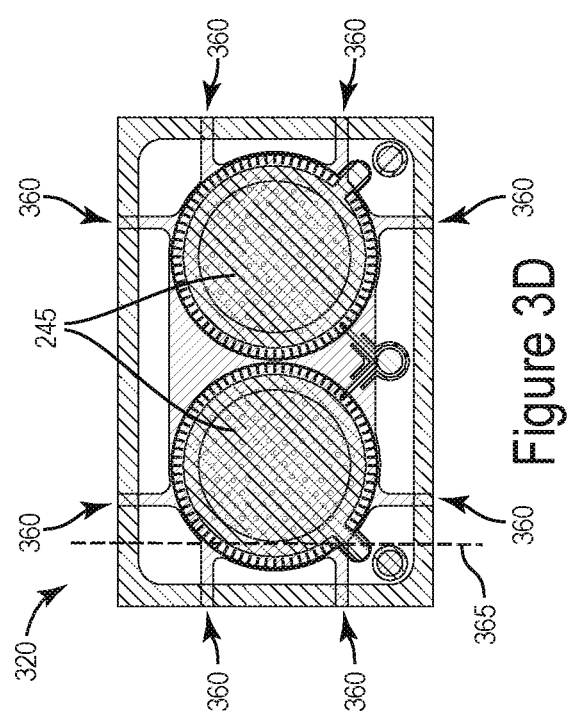

ACOUSTIC RELIEF IN MEMS

CROSS-REFERENCE TO RELATED APPLICATIONS

This application is a National Stage Application of PCT/US2018/043799, filed Jul. 26, 2018, which claims the benefit of and priority to U.S. Provisional Patent Application No. 62/537,240, filed Jul. 26, 2017, the entire contents of which are incorporated herein by reference.

TECHNICAL FIELD

The present disclosure relates, in general, to microelectromechanical systems microphones. More particularly, the present disclosure relates to acoustic relief in such microphones for high sound pressure level applications.

BACKGROUND

The following description is provided to assist the understanding of the reader. None of the information provided or references cited is admitted to be prior art. Microelectromechanical system (MEMS) can be used in microphones to convert acoustic energy into an electrical signal. The electrical signal can be used by a device such as a laptop computer, a cell phone, a tablet, etc. MEMS microphones have typically been used for low sound pressure level acoustic activity, but traditional MEMS microphones typically have poor characteristics for high sound pressure level (SPL) acoustic activity.

SUMMARY

An illustrative microelectromechanical system (MEMS) motor includes a substrate, a backplate, and a diaphragm. The substrate has a first surface and a second surface. The second surface has a slot that extends at least partially into the substrate. A port extends through the substrate. The backplate is mounted to the first surface of the substrate, and the backplate covers at least a portion of the port. The diaphragm is between the backplate and the substrate. The diaphragm moves with respect to the backplate in response to acoustic energy that passes through the port.

In some embodiments of the MEMS motor, the second surface is configured to be mounted to a microphone substrate, and the slot forms a leakage pathway between the substrate of the MEMS motor and the microphone substrate. In some embodiments, the slot extends from an outside edge of the substrate to the port. In some embodiments, the second surface comprises a plurality of slots that extend at least partially into the substrate. In some embodiments, the slot is between 40 micrometers and 50 micrometers wide, and the slot is approximately 200 micrometers long. In such embodiments, an aspect ratio of the width of the slot to a length of the slot is at most 0.25. In an illustrative embodiment, a leakage pathway though the slot does not pass between the backplate and the diaphragm.

An illustrative microphone includes a microelectromechanical system (MEMS) motor, a microphone substrate, and a cover. The MEMS motor includes a MEMS substrate with a first surface and a second surface. A first port extends through the MEMS substrate. The MEMS motor also includes a backplate mounted to the first surface of the MEMS substrate. The backplate covers at least a portion of the first port. The MEMS motor further includes a diaphragm between the backplate and the MEMS substrate. The diaphragm moves with respect to the backplate in response to acoustic energy passing through the first port. The microphone substrate has a first surface and a second surface. The first surface of the microphone substrate includes a slot that extends at least partially into the substrate. The cover is mounted to the microphone substrate. The cover surrounds the MEMS motor. The cover and the microphone substrate enclose a back volume. The MEMS motor is mounted to the first surface of the microphone substrate such that the slot in the microphone substrate forms a first leakage pathway between the first port of the MEMS motor and the back volume.

An illustrative microphone includes a microelectromechanical system (MEMS) motor, a microphone substrate, a cover, and a solder mask. The MEMS motor includes a MEMS substrate with a first surface and a second surface. A first port extends through the MEMS substrate. The MEMS motor also includes a backplate mounted to the first surface of the MEMS substrate. The backplate covers at least a portion of the first port. The MEMS motor further includes a diaphragm between the backplate and the MEMS substrate. The diaphragm moves with respect to the backplate in response to acoustic energy passing through the first port. The microphone substrate has a first surface and a second surface. The cover is mounted to the microphone substrate. The cover surrounds the MEMS motor. The cover and the microphone substrate enclose a back volume. The solder mask is disposed between the first surface of the microphone substrate and the second surface of the MEMS substrate. The solder mask includes a slot extending from the first port of the MEMS substrate to an outside edge of the MEMS substrate such that the slot in the solder mask forms a leakage pathway to the back volume.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

FIGS. 3A and 3C are cross-sectional views of a MEMS motor in accordance with an illustrative embodiment.

FIGS. 3B and 3D are top views of a MEMS motor in accordance with an illustrative embodiment.

Figure 1A:
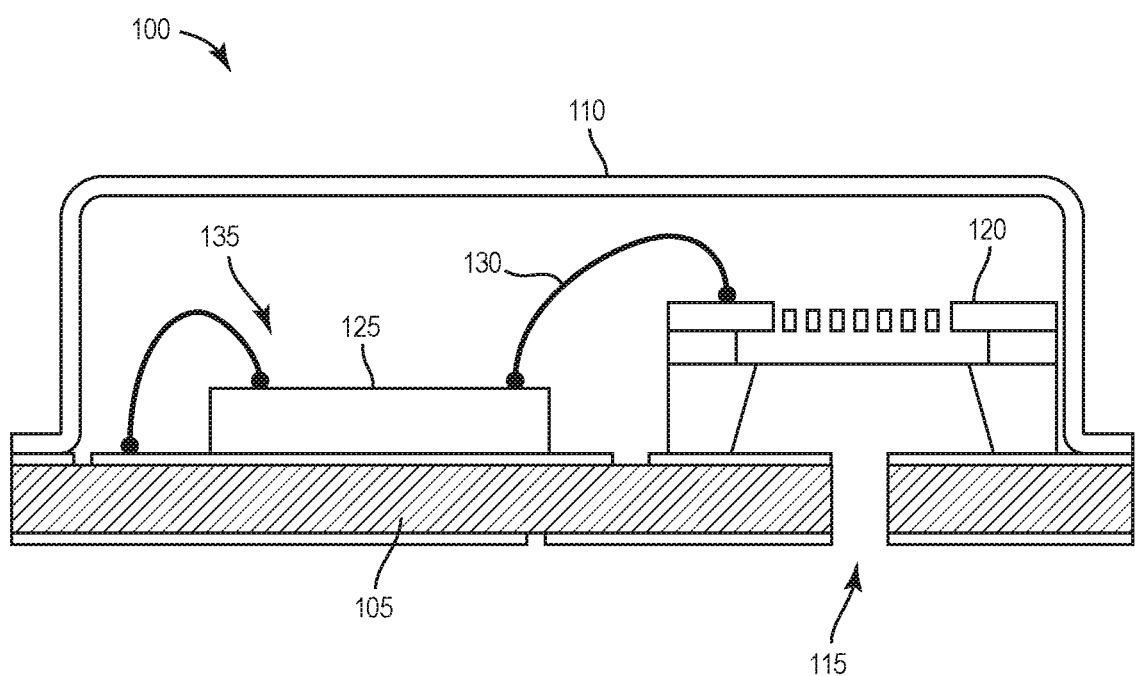
FIGS. 1A-1C are cross-sectional views of MEMS microphones in accordance with illustrative embodiments.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Microelectromechanical systems (MEMS) microphones can be used in diverse electronic devices such as laptops, cell phones, tablets, etc. The MEMS element may include a backplate and a diaphragm. The backplate may be fixed relative to the device, and the diaphragm may move relative to the backplate when acoustic energy encounters the diaphragm. Thus, acoustic energy can cause the diaphragm to vibrate or oscillate with respect to the backplate. A capacitance between the backplate and the diaphragm changes based on the changes in distance between the backplate and the diaphragm.

Many MEMS microphones are rated for particular conditions such as sound pressure level (SPL). The sound pressure level is the change in pressure caused by an acoustic wave. That is, an acoustic wave is a compression or decompression of air (or other material such as water), and the sound pressure level relates to the amount of compression or decompression. The higher the sound pressure level, the more the air is compressed or decompressed. For relatively high sound pressure levels, many MEMS microphones do not perform well. For example, if a sound wave has too high of a sound pressure level, the capacitance between the backplate and the diaphragm may not be indicative of the sound wave. That is, too high of a sound pressure level can push the MEMS device beyond its rated operating conditions, thereby resulting in poor output signals.

In various embodiments described herein, acoustic pathways are provided in a MEMS microphone that allow for faster and/or more efficient equalization of air pressure across a MEMS motor. In traditional MEMS microphones, equalization of air pressure across the MEMS motor relies on air to pass between the diaphragm and the backplate, which are typically air-flow restrictive. However, in high sound pressure level applications, quicker equalization of pressures between a back volume of the MEMS microphone and an external environment increases the sound quality output by the MEMS microphone. In various embodiments described herein, air pathways are provided that bypass the backplate/diaphragm of the MEMS motor, thereby allowing for additional air flow between the back volume of the MEMS microphone and the external environment.

Figure 1B:
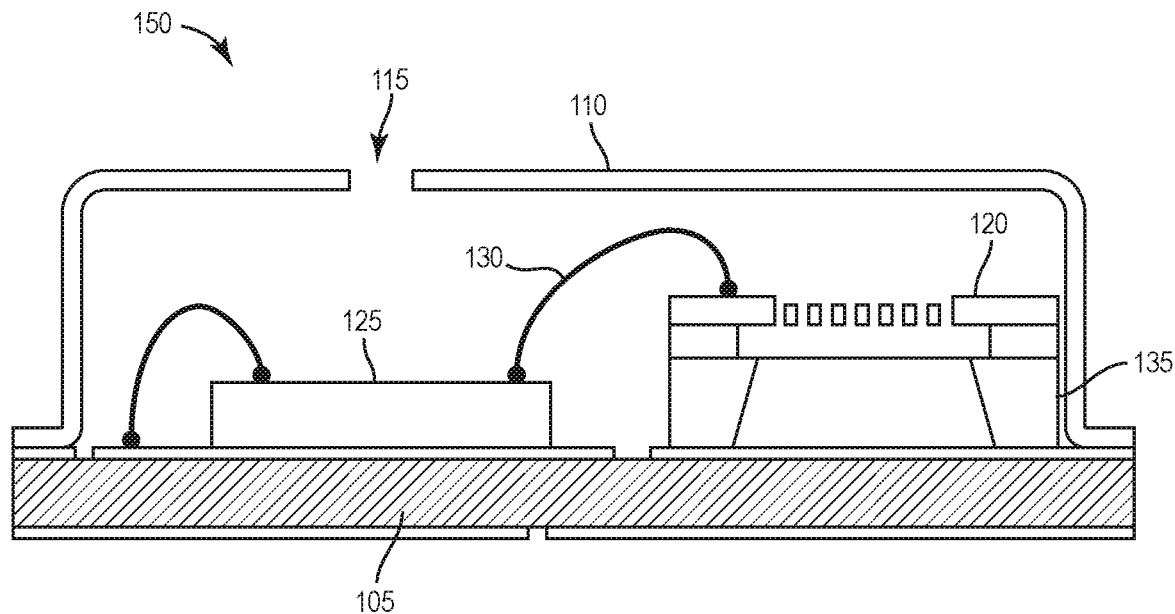
Figure 1C:
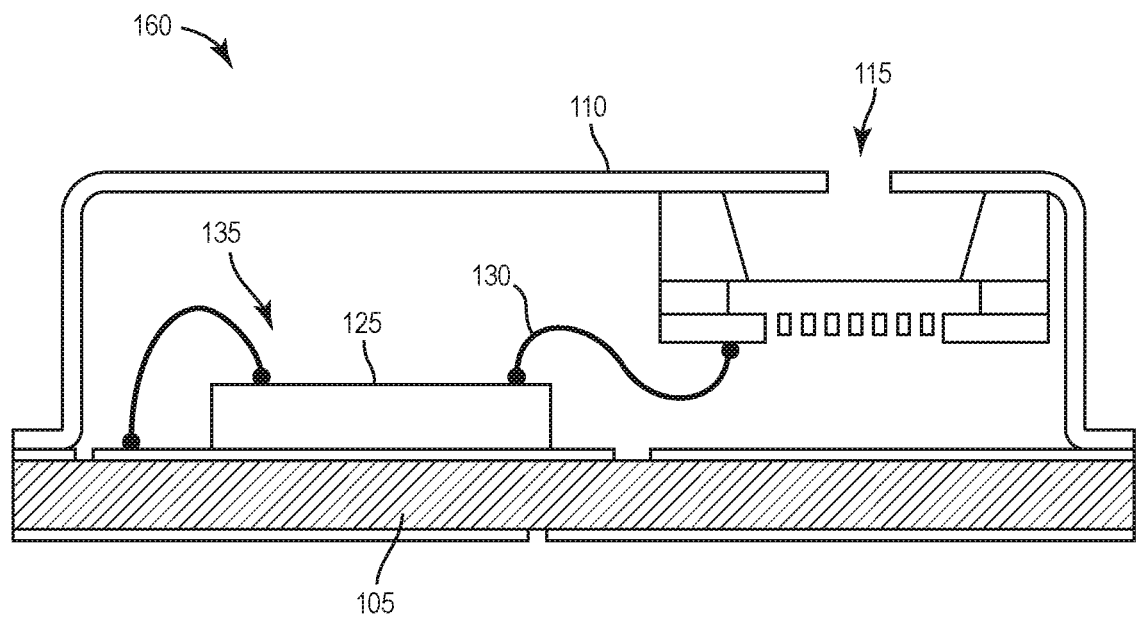

FIGS. 1A-1C are cross-sectional views of MEMS microphones in accordance with illustrative embodiments. The MEMS microphone 100 of FIG. 1A includes a substrate 105, a cover 110, a MEMS motor 120, and a processing circuit 125. In alternative embodiments, additional, fewer, and/or different elements may be used.

In the embodiment shown in FIG. 1A, the MEMS motor 120 is oriented over the acoustic port 115 that extends through the substrate 105. A seal is formed between the substrate 105 and the cover 110 such that air flows between an external environment and a back volume 135 through the acoustic port 115 and the MEMS motor 120.

FIG. 1A is an illustration of a bottom-port style MEMS microphone in that the acoustic port 115 extends through the substrate 105 and the MEMS motor 120 is oriented over the acoustic port 115. The MEMS microphone 150 of FIG. 1B includes similar elements as the MEMS microphone 100 of FIG. 1A, but with the acoustic port 115 extending through the cover 110. Thus, the back volume 135 is defined by the inside surface of the substrate of the MEMS motor 120 and the substrate 105. The MEMS microphone 150 may be referred to as a top-port style of MEMS microphone. The MEMS microphone 160 of FIG. 1C includes similar elements as the MEMS microphone 100 of FIG. 1A and the MEMS microphone 150 of FIG. 1B, but with the acoustic port 115 extending through the cover 110 and the MEMS motor 120 oriented over the acoustic port 115. The MEMS microphone 160 may be referred to as a MEMS-on-lid style of MEMS microphone. Although FIGS. 1A-1C show three different configurations of elements, any other suitable arrangement of elements may be used. For example, the processing circuit 125 may be attached to the cover 110 or may be integrated into the MEMS motor 120, or external electrical pads for communicating with an external device may be located on an outside surface of the substrate 105 and/or the cover 110.

Figure 2A:
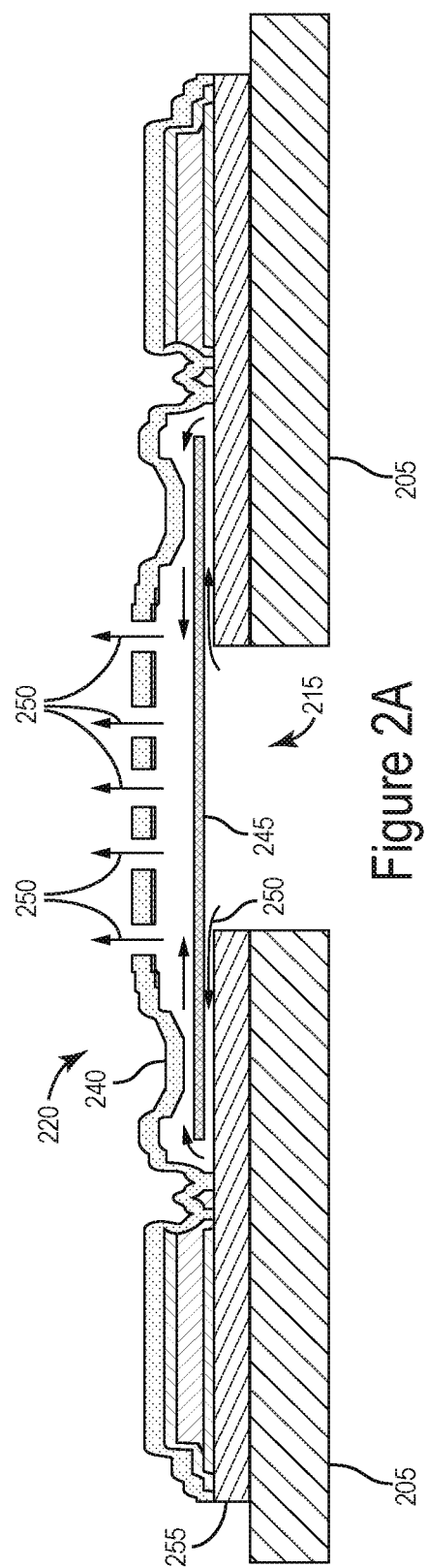
FIG. 2A is a cross-sectional view of a MEMS motor.
Figure 2B:
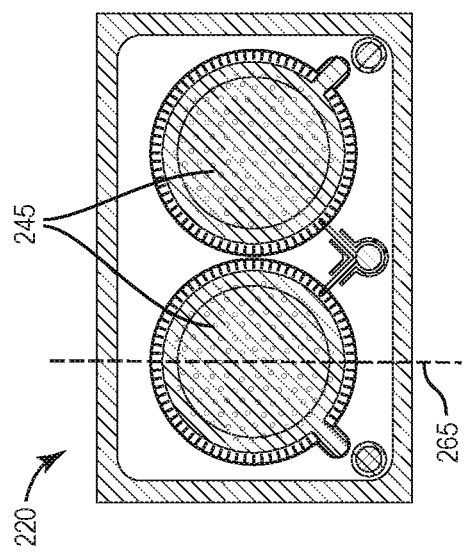
FIG. 2B is a top view of a MEMS motor.

FIG. 2A is a cross-sectional view of a MEMS motor 220 along the line 265 of FIG. 2B. The MEMS motor 220 includes a backplate 240, a diaphragm 245, and a microphone substrate 205. The microphone substrate 205 with an acoustic port 215 may be mounted on the substrate 105 of the MEMS microphone 100. For example, the acoustic port 215 may be aligned with the acoustic port 115. In an illustrative embodiment, as air pressure and/or acoustic energy passes through the acoustic port 215, the diaphragm 245 moves closer or further away from the backplate 240. A capacitance between the backplate 240 and the diaphragm 245 can be monitored to convert the acoustic energy into an electrical signal indicative of the acoustic energy. For example, the processing circuit 125 can monitor the capacitance of the MEMS motor 120 or the MEMS motor 220 and generate an electrical signal indicative of the acoustic energy, which may be digital or analog.

As shown in FIG. 2A, the backplate 240 includes vent holes that allow air to pass through the backplate 240. The arrows 250 illustrate the path of air through the acoustic port 215, past the diaphragm 245, and through the vent holes in the backplate 240. Although the arrows 250 indicate movement in a particular direction, in alternative embodiments the air can flow in the opposite direction. The MEMS motor 220 shown in FIG. 2A is a free-plate design in that the diaphragm 245 is not mechanically coupled to the backplate 240 or the microphone substrate 205 and has some degree of freedom from the backplate 240 and/or the microphone substrate 205. However, in alternative embodiments, any other suitable design may be used, such as a constrained-plate design (e.g., a design in which the diaphragm 245 is secured to the backplate 240 and/or the microphone substrate 205).

In instances with a high sound pressure level, the air pathway shown in FIG. 2A may be too restrictive. By not allowing the air pressure across the MEMS motor 120 or the MEMS motor 220 to equalize quickly enough, the electrical signal from the MEMS microphone 100 may become distorted. In various embodiments described herein, different and/or additional air pathways are provided to more quickly equalize air pressure across the MEMS motor 120.

FIGS. 3A and 3C are cross-sectional views of a MEMS motor in accordance with an illustrative embodiment. Similar to the MEMS motor 220 of FIG. 2A, the MEMS motor 320 includes a backplate 240, a diaphragm 245, and a microphone substrate 205. The microphone substrate 205 is fixed to a substrate of a MEMS microphone (e.g., substrate 105 of the MEMS microphone 100). FIG. 3A is a cross-sectional view of the MEMS motor 320 along the line 365 of FIG. 3B, and FIG. 3C is a cross-sectional view of the MEMS motor 320 along the line 365 of FIG. 3D. As shown in FIGS. 3B and 3D, the MEMS motor 320 can include two diaphragms 245 (and two corresponding backplates 240). In alternative embodiments, any suitable number of diaphragms 245 may be used. For example, one diaphragm 245 or greater than two diaphragms 245 may be used. In some instances, the greater the number of diaphragms 245, the greater the total area of the acoustic port 215 and the greater the total area of the diaphragms 245, which increases performance for high sound pressure levels.

As shown in FIGS. 3B and 3D, the MEMS motor 320 can include slots 360 that extend from the acoustic port 215 to an outside edge of the MEMS motor 320. As shown in FIG. 3A, the slots 360 can provide a leakage pathway for air to pass between the MEMS motor 320 and the microphone substrate 205, as shown by the arrows labeled 350. Thus, referring to FIGS. 1A-1C, the slots 360 can provide a leakage pathway for air to move from the outside environment to the back volume 135 without passing around a diaphragm. Decreasing the restriction of air flow between the outside environment and the back volume 135 can improve the linearity of the response of the microphone at relatively low frequencies. In the embodiments illustrated in FIGS. 3A and 3C, the slots 360 are formed on a bottom surface of the substrate 255. In alternative embodiments, the slots 360 can be formed in the microphone substrate 205.

In the embodiments shown in FIGS. 3B and 3D, each acoustic port 215 includes four slots 360. In alternative embodiments, each acoustic port 215 can include less than four slots 360 or greater than four slots 360. Four slots 360 can be used to evenly provide a leakage pathway around the diaphragm 245. For example, in embodiments in which one slot 360 is used, turbulence created by air passing through the slot 360 can create an undesirable response of the microphone at high sound pressure levels. Using multiple slots 360 that are longer than they are wide (e.g., a high aspect ratio), the flow of air through the slots 360 is more laminar and less turbulent, thereby improving performance of the MEMS motor 320. In an illustrative embodiment, each slot 360 has a cross sectional area of 50 micrometers (µm) wide by 40 µm tall and is approximately 200 µm long. In such an embodiment, the aspect ratio of the width to the length of the slots 360 is at most 0.25. In alternative embodiments, each slot 360 may be wider or narrower than 50 µm, taller or shorter than 40 µm, and/or longer or shorter than 200 µm. Thus, in such embodiments, the aspect ratio of the slots 360 may be adjusted higher or lower for a particular application. For example, simulations of a microphone and/or a MEMS motor 120 may be run to determine a most suitable aspect ratio. The size and number of slots 360 can be varied in the simulation to determine a suitable size (e.g., aspect ratio) and number of slots for the particular application.

Although not explicitly shown in FIGS. 3A and 3C, the MEMS substrate 255 and the substrate 205 may be fixed to one another using any suitable method. For example, an epoxy or glue may be used between the MEMS substrate 255 and the substrate 205. In such an example, the epoxy or glue may be used such that the epoxy or glue does not interfere with or fill the slots 360.

Figure 4:
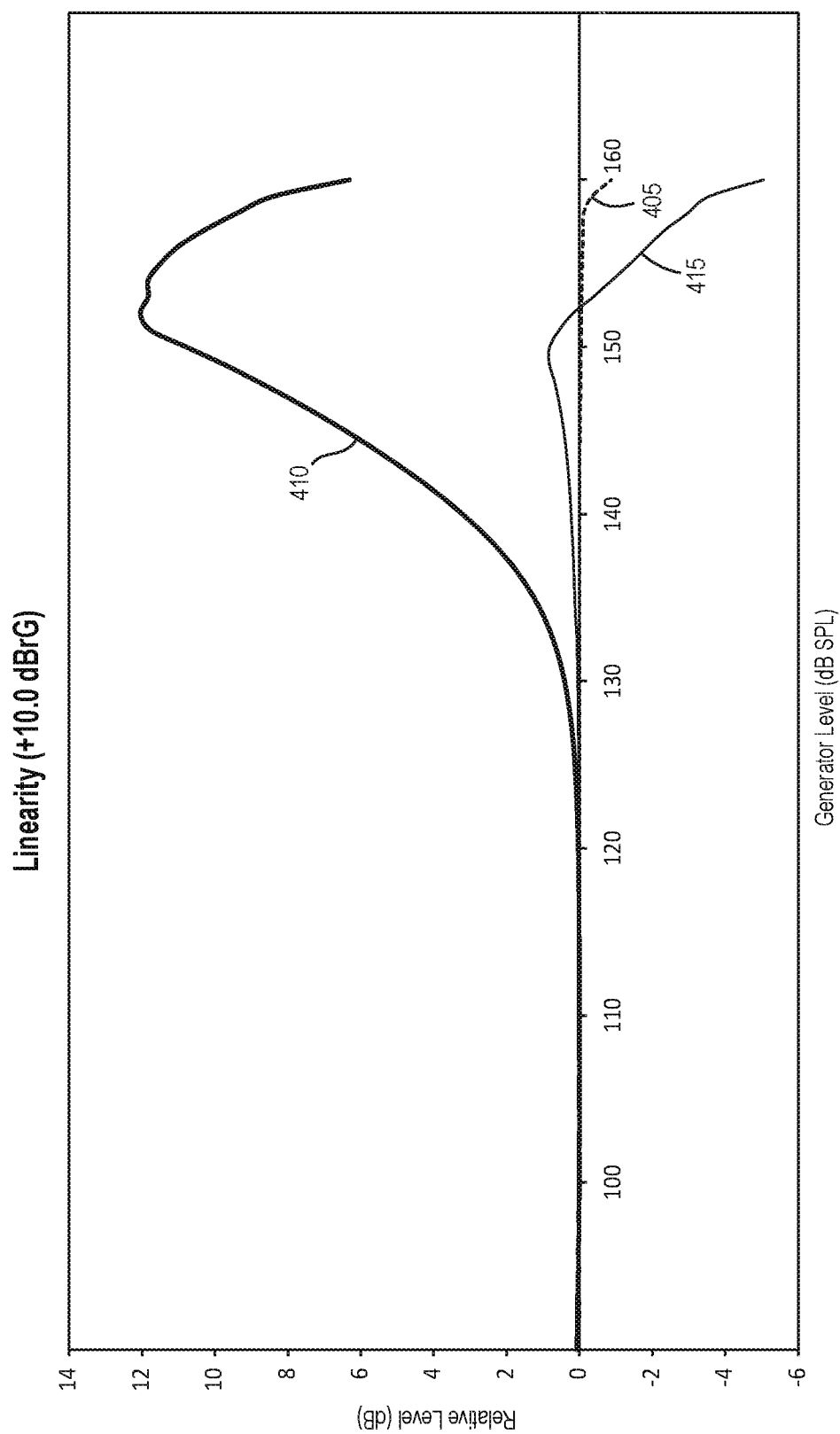
FIG. 4 is a graph of output linearity of MEMS microphones in accordance with an illustrative embodiment.

FIG. 4 is a graph of output linearity of MEMS microphones in accordance with an illustrative embodiment. The graph of FIG. 4 includes sound output level of a sound generator in decibels (dB) on the x-axis, and a relative output of MEMS microphones in dB on the y-axis. A reference factor of +10 dBrG (decibels with reference to the generator) was applied to the output of the MEMS microphones to determine the relative output shown in FIG. 4. That is the curves in the graph of FIG. 4 have been normalized by approximately 104 dB SPL. Because the y-axis is a relative output, a perfectly linear microphone would have an output of 0 dB at all generator output levels (i.e., along the x-axis). The dashed line 405 plots the relative output of a reference signal (e.g., a signal from a microphone that is used as a reference for comparison), the line 410 plots the relative output of a MEMS microphone with a single large acoustic pathway, and the line 415 plots the relative output of a MEMS microphone with multiple acoustic pathway slots 360 (e.g., the MEMS motor 320 of FIGS. 3A-3D).

As shown by line 410, above about 130 dB of the generator sound output, the MEMS microphone with one large acoustic pathway becomes increasingly non-linear. Above a generator output of about 140 dB, the relative output of the MEMS microphone without the slots 360 is above 4 dB. However, the relative output of the MEMS microphone with multiple slots 360 is substantially linear up to a generator output of about 155 dB, as shown by the line 415. For example, the relative output of the MEMS microphone with the slots 360 is within about +/−1 dB for generator output levels below about 155 dB.

Figure 5:
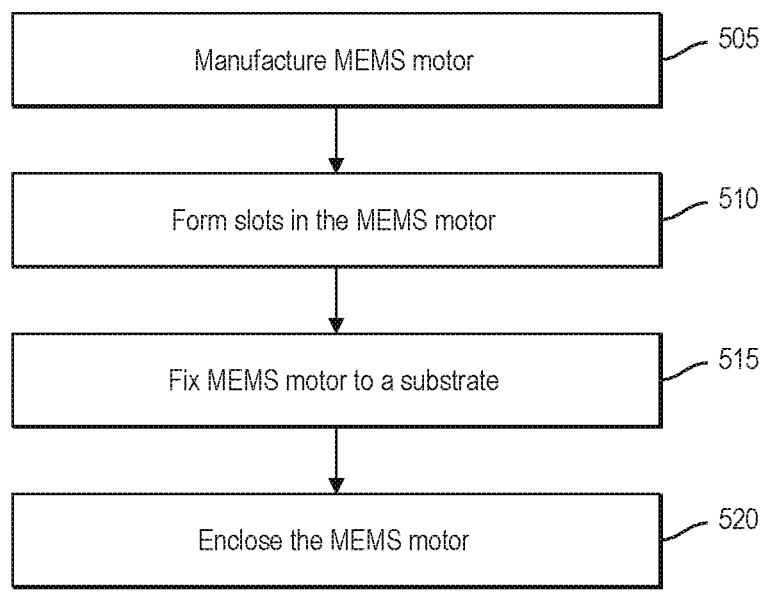
FIG. 5 is a flow chart of a method for manufacturing a MEMS motor in accordance with an illustrative embodiment.

FIG. 5 is a flow chart of a method for manufacturing a MEMS motor in accordance with an illustrative embodiment. In alternative embodiments, additional, fewer, and/or different operations may be performed. Also, the use of arrows and a flow chart is not meant to be limiting with respect to the order or flow of operations or information. For example, in alternative embodiments, two or more operations may be performed simultaneously.

In an operation 505, a MEMS motor is manufactured. For example, the MEMS motor 220 may be manufactured with a MEMS substrate, a backplate, and a diaphragm. The MEMS motor may be manufactured using any suitable method.

Figure 6:
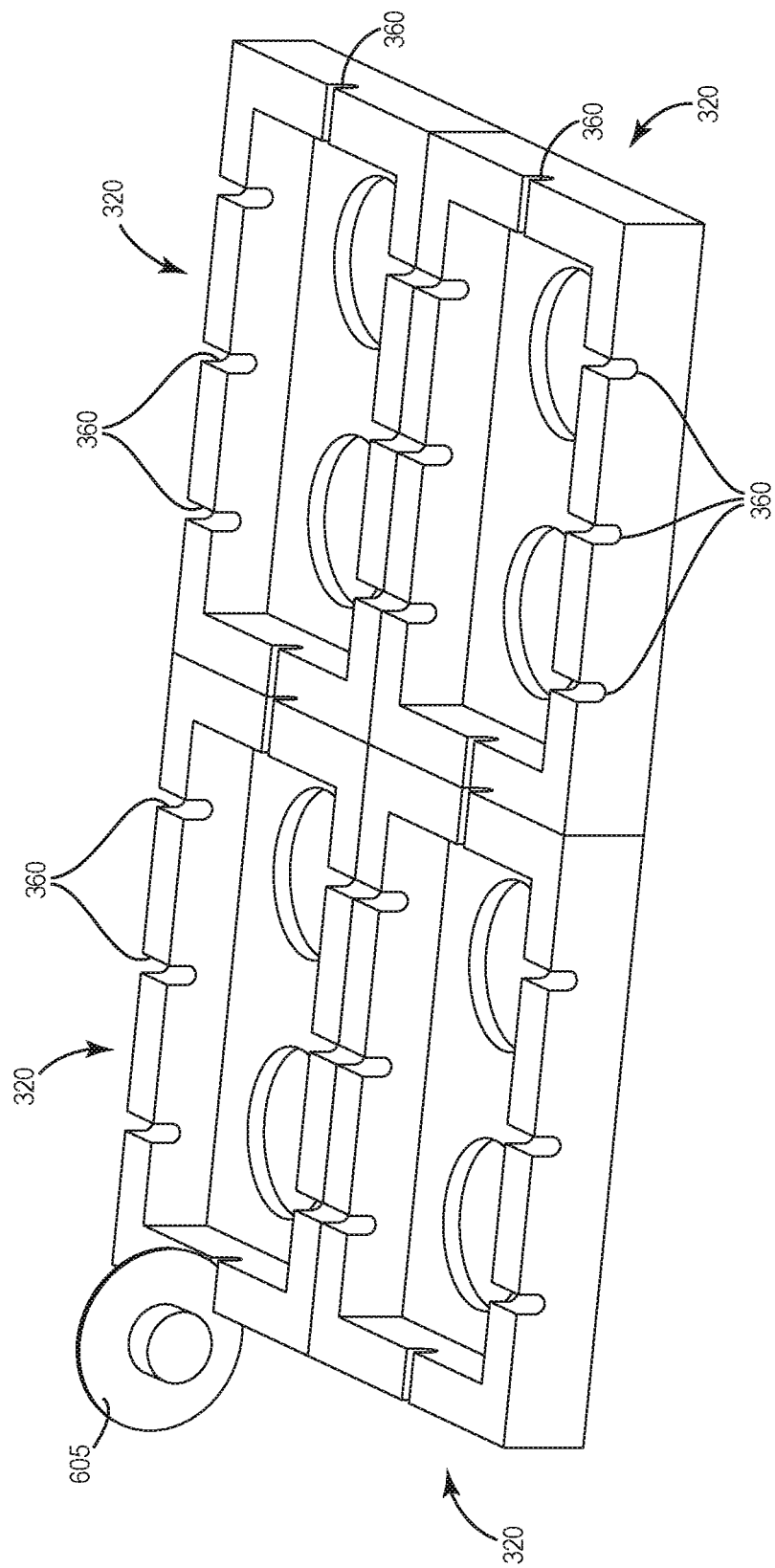
FIG. 6 is an illustration of slots in a MEMS motor being formed via a cutting disk in accordance with an illustrative embodiment.

In an operation 510, slots are formed in the MEMS motor. In an illustrative embodiment, slots 360 are formed on a bottom side of the MEMS substrate. Any suitable method can be used to form the slots 360. For example, FIG. 6 is an illustration of slots in a MEMS motor being formed via a cutting disk in accordance with an illustrative embodiment. As shown in FIG. 6, a cutting disk 605 can be used to cut the slots 360. In the embodiment shown in FIG. 6, the slots 360 can be simultaneously formed in multiple MEMS motors 320, such as before the MEMS motors 320 are diced into individual MEMS motors 320.

Figure 7A:
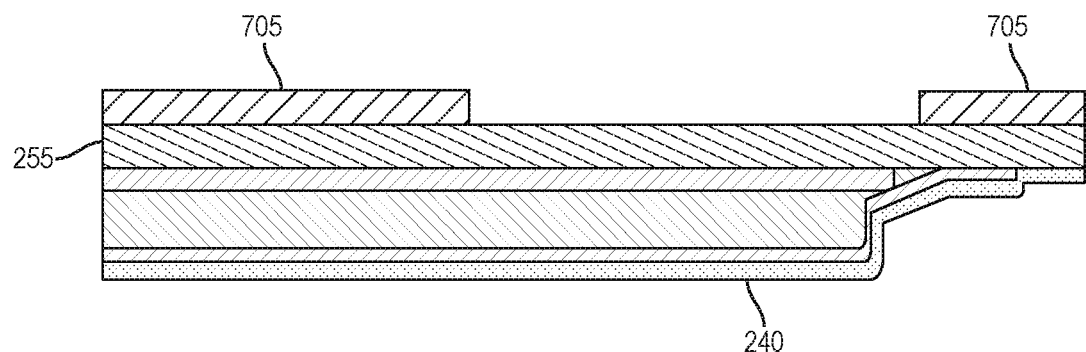
FIGS. 7A and 7B are illustrations of slots in a MEMS motor being formed via etching in accordance with an illustrative embodiment.
Figure 7B:
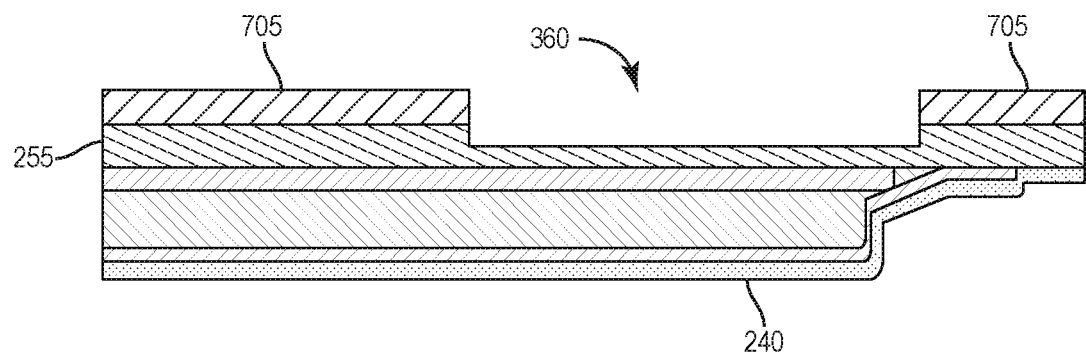

FIGS. 7A and 7B are illustrations of slots in a MEMS motor being formed via etching in accordance with an illustrative embodiment. FIG. 7A is a cross-sectional view of a portion of a MEMS motor with a MEMS substrate 255 and a backplate 240. The bottom side of the substrate 255 (which is at the top of the substrate 255 in FIGS. 7A and 7B) can be masked using a mask 705. Etching, such as deep reactive ion etching (DRIE), can be used to etch away a portion of the MEMS substrate 255 that is not covered by the mask 705, thereby forming the slot 360 in FIG. 7B. Although FIGS. 3B and 3D show the slots 360 as being straight, in alternative embodiments such as those using an etching method to form the slots 360, the slots 360 can be any suitable shape. The mask 705 can be removed from the MEMS substrate 255.

In an operation 515, the MEMS motor can be fixed to a substrate. For example, as shown in FIG. 1A, the MEMS motor 120 can be fixed to the substrate 105. The bottom side of the MEMS motor (e.g., the side with the slots formed therein) can be the side of the MEMS motor that is fixed to the substrate of the MEMS microphone. The acoustic port of the MEMS motor 120 can be aligned with the acoustic port of the MEMS microphone substrate such that acoustic energy can pass through.

In an operation 520, the MEMS motor can be enclosed. For example, as shown in FIG. 1A, a lid 110 can be fixed to the substrate 105 such that the MEMS motor 120 is within a volume defined by the lid 110 and the substrate 105. As mentioned above, although FIG. 1A shows a bottom-port MEMS microphone, the MEMS motor with the slots 360 can be used in any suitable configuration, such as a top-port MEMS microphone (e.g., as in FIG. 1B) or a MEMS-on-lid microphone (e.g., as in FIG. 1C).

In various embodiments discussed above with respect to FIGS. 3-7, a leakage path is created by forming slits in the bottom of the MEMS motor that create a pathway for air to pass between the back volume and the acoustic port (e.g., for bottom port and MEMS-on-lid styles of microphones). However, the leakage pathways can be formed in any other suitable manner. For example, in embodiments in which the MEMS motor is epoxied to a microphone substrate, gaps in the solder mask around the MEMS motor can provide a leakage pathway.

Figure 8:
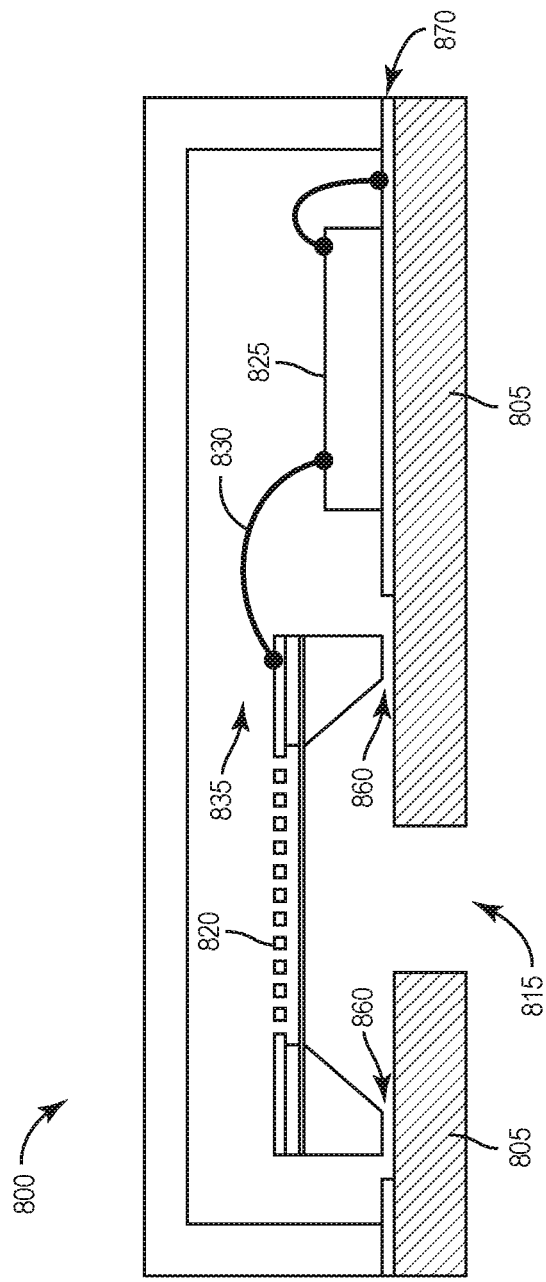
FIG. 8 is a cross-sectional view of a MEMS microphone in accordance with an illustrative embodiment.

FIG. 8 is a cross-sectional view of a MEMS motor in accordance with an illustrative embodiment. The MEMS microphone 800 includes a microphone substrate 805 with an acoustic port 815 and an ASIC 825 electrically connected to a MEMS motor 820 via a wire 830. In alternative embodiments, additional, fewer, and/or different elements may be used.

Figure 12:
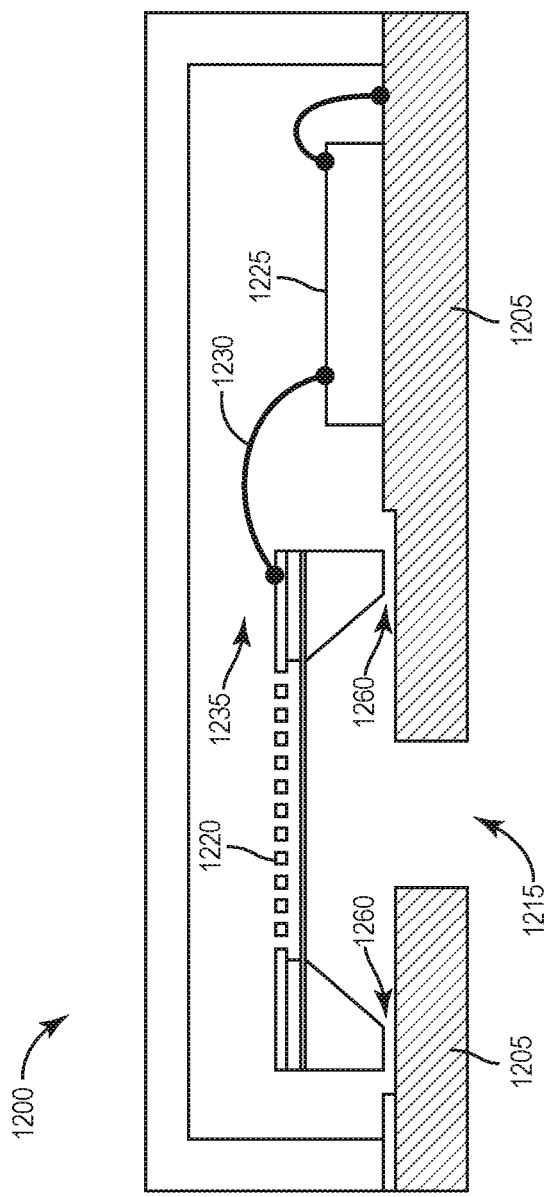
FIG. 12 is a cross-sectional view of a MEMS microphone in accordance with an illustrative embodiment.

As shown in FIG. 8, slots 860 provide a leakage pathway between the acoustic port 815 and the back volume 835. The slots 860 may perform similar functions as the slots 360 of FIG. 3A. In the embodiment illustrated in FIG. 8, the slots 860 are formed within the solder mask. In the embodiment shown in FIG. 8, the slots 860 are formed by a lack of solder mask between the MEMS motor 820 and the microphone substrate 805. In some embodiments, such as the embodiment shown in FIG. 12, the slots may be formed in the microphone substrate 805 instead of or in addition to being formed in a solder mask.

Figure 9A:
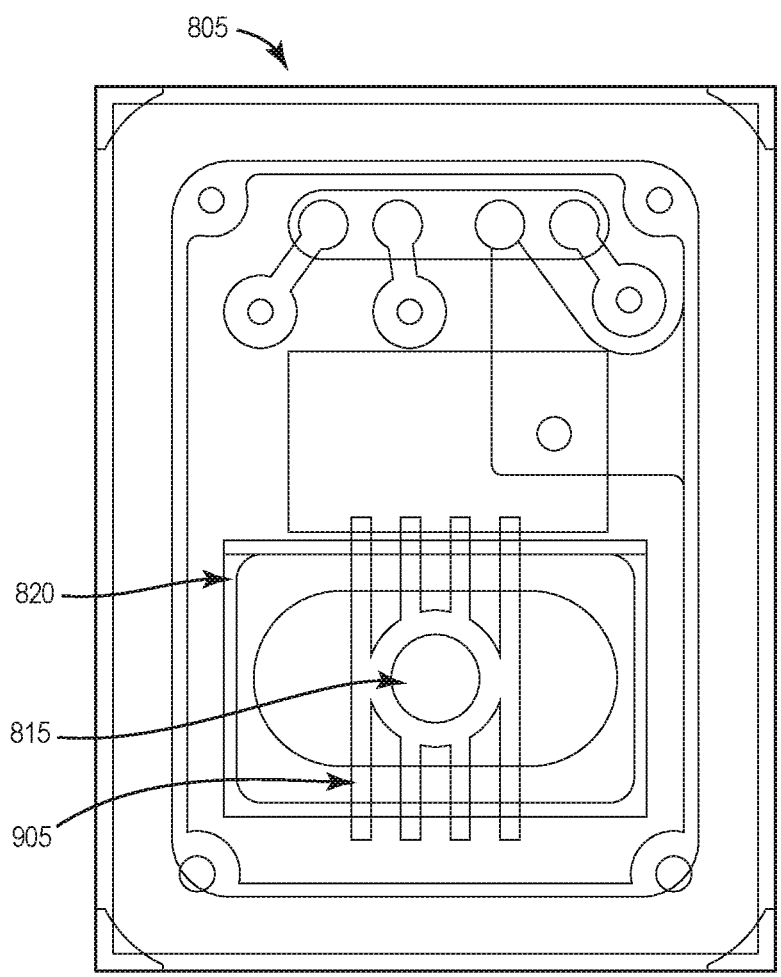
FIGS. 9A-9C are solder mask outlines in accordance with illustrative embodiments.
Figure 9B:
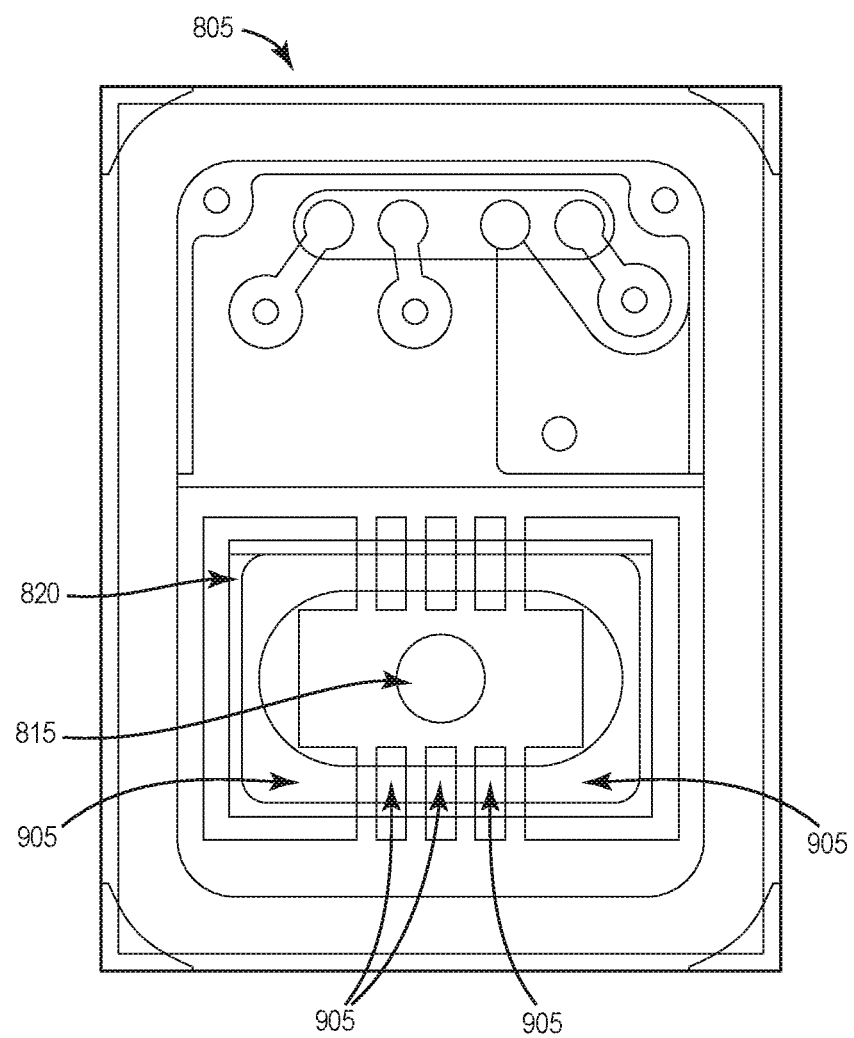
Figure 9C:
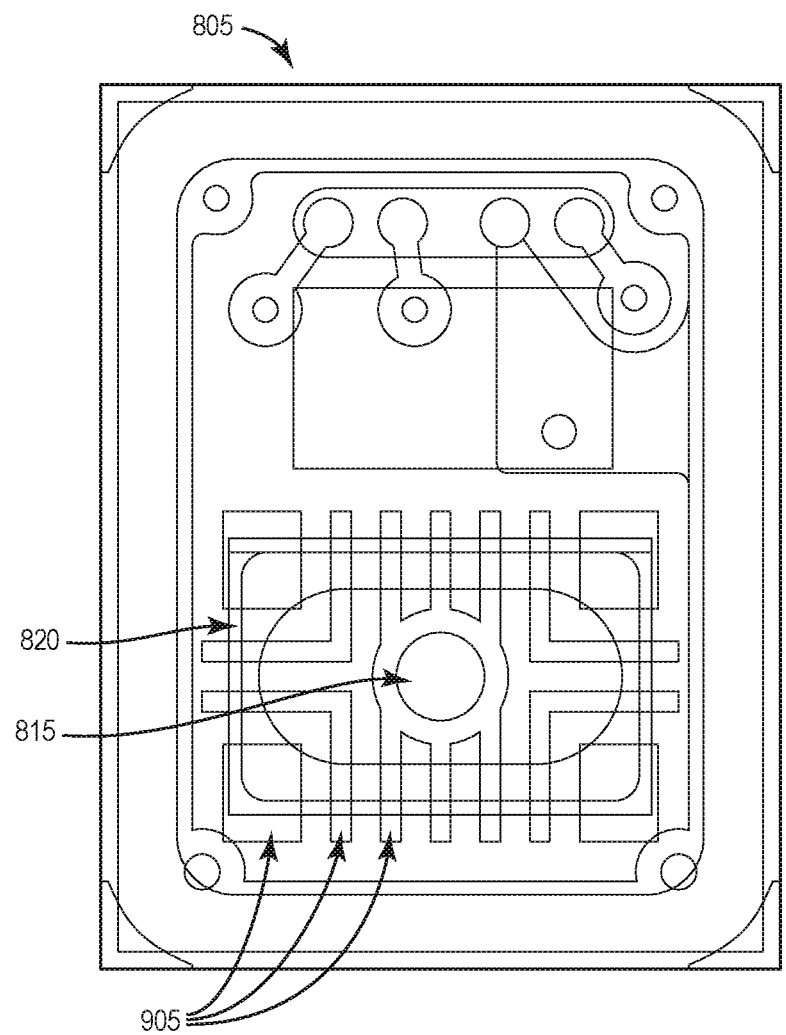

FIGS. 9A-9C are solder mask outlines in accordance with illustrative embodiments. The views of FIGS. 9A-9C show solder masks for the top surface of the microphone substrate 805 (i.e., the surface of the microphone substrate 805 that the ASIC 825 and the MEMS motor 820 are attached). Each of FIGS. 9A-9C include the acoustic port 815 around which is the outline of the MEMS motor 820. Solder is not present within the areas 905. In some embodiments, a solder mask can be used that does not place solder within the areas 905. In alternative embodiments, solder can be placed within the areas 905 and then removed (e.g., via etching).

In the embodiment shown in FIG. 9A, the slots formed by areas 905 can be 80 micrometers wide, 45 micrometers tall, and be separated by 120 micrometers. The embodiment shown in FIG. 9A has eight slots total, with four slots on a first side and four on an opposing side. In some instances, the configuration of the embodiment shown in FIG. 9A provides adequate leakage pathways while also securely holding the MEMS motor 820 to the microphone substrate 805. However, in alternative embodiments, any suitable shape or orientation of the areas 905 can be used, such as those shown in FIGS. 9B and 9C.

In alternative embodiments, the slots can be any suitable shape. For example, using one large slot can provide a high amount of desensitization because it has a low acoustic resistance. But, using one large slot may have non-linear performance. Using multiple, smaller slots mitigates some of the non-linear performance, but may have a higher total acoustic resistance than the single large slot. The specific orientation or design of the slots can be selected depending upon the specific use of the microphone 800.

Figure 10:
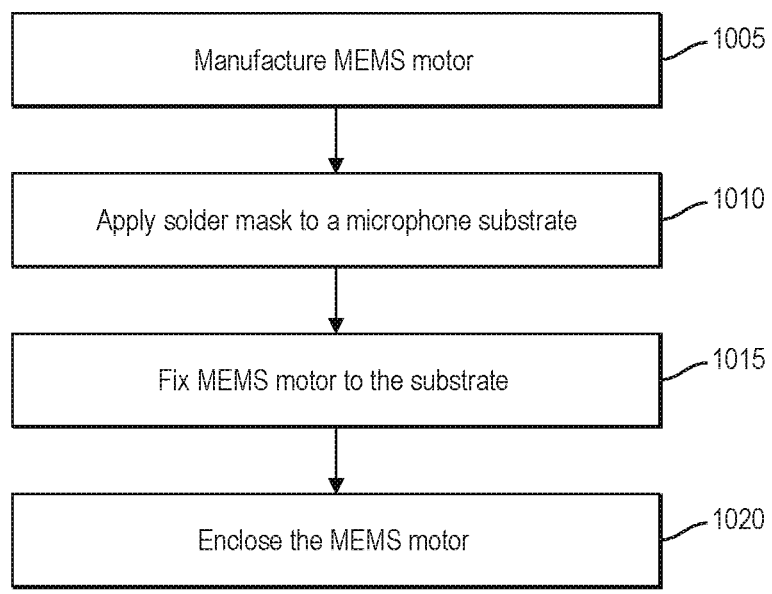
FIG. 10 is a flow chart of a method for manufacturing a MEMS microphone in accordance with an illustrative embodiment.

FIG. 10 is a flow chart of a method for manufacturing a MEMS microphone in accordance with an illustrative embodiment. In alternative embodiments, additional, fewer, and/or different operations may be performed. Also, the use of arrows and a flow chart is not meant to be limiting with respect to the order or flow of operations or information. For example, in alternative embodiments, two or more operations may be performed simultaneously.

In an operation 1005, a MEMS motor is manufactured. For example, the MEMS motor 820 may be manufactured with a MEMS substrate, a backplate, and a diaphragm. The MEMS motor may be manufactured using any suitable method.

In an operation 1010, a solder mask is applied to the microphone substrate. For example, one of the solder masks illustrated in FIGS. 9A-9C can be used. In an operation 1015, the MEMS motor can be fixed to a substrate. For example, the MEMS motor can be soldered to the substrate via the solder applied in the operation 1010. The solder between the MEMS motor and the substrate has slots (e.g., slots 860) with no solder that provides a leakage pathway for air to pass between the acoustic port of the microphone substrate and the back volume of the microphone (once assembled).

In an operation 1020, the MEMS motor can be enclosed. For example, as shown in FIG. 8, a lid can be fixed to the substrate 805 such that the MEMS motor 820 is within a volume defined by the lid and the substrate 805. Although FIG. 8 shows a bottom-port MEMS microphone, the MEMS motor with the slots 860 in the solder mask can be used in any suitable configuration, such as a top-port MEMS microphone (e.g., as in FIG. 1B) or a MEMS-on-lid microphone (e.g., as in FIG. 1C).

Figure 11:
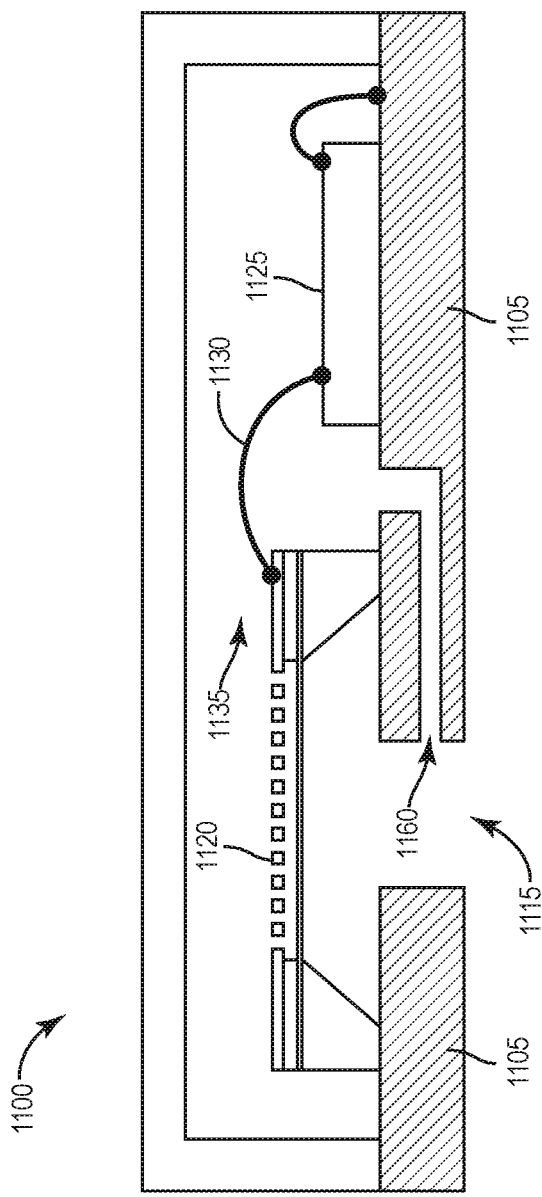
FIG. 11 is a cross-sectional view of a MEMS microphone with a leakage pathway in the microphone substrate in accordance with an illustrative embodiment.

FIG. 11 is a cross-sectional view of a MEMS microphone with a leakage pathway in the microphone substrate in accordance with an illustrative embodiment. The MEMS microphone 1100 includes a microphone substrate 1105 with an acoustic port 1115, and an ASIC 1125 electrically connected to a MEMS motor 1120 via a wire 1130. In alternative embodiments, additional, fewer, and/or different elements may be used.

In the embodiment of FIG. 11, the microphone substrate 1105 includes a leakage pathway 1160 formed within the microphone substrate 1105. Although FIG. 11 depicts one leakage pathway 1160, any other suitable number of leakage pathways can be used. The leakage pathway 1160 is formed to provide a path for air to pass between the acoustic port 1115 and the back volume 1135.

The leakage pathway 1160 can be formed in any suitable manner. For example, the leakage pathway 1160 may be formed by removing material from the microphone substrate 1105 (e.g., via etching, drilling, etc.). In another example, the substrate 1105 may be built up using multiple layers of material. Various layers may be formed without material at the leakage pathway 1160. In some instances, the leakage pathway 1160 may be beneficial as compared to shorter leakage pathways, as a single, relatively long leakage pathway 1160 reduces non-linearity of the microphone performance as compared to shorter pathways.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone comprising:
a microelectromechanical system (MEMS) motor comprising:
a MEMS substrate with a first surface and a second surface, wherein a first port extends through the MEMS substrate;
a backplate mounted to the first surface of the MEMS substrate, wherein the backplate covers at least a portion of the first port; and
a diaphragm between the backplate and the MEMS substrate, wherein the diaphragm moves with respect to the backplate in response to acoustic energy passing through the first port;

a microphone substrate with a first surface and a second surface, wherein the microphone substrate comprises a leakage pathway that extends at least partially into the microphone substrate and comprises an open slot on each end of the leakage pathway; and a cover mounted to the microphone substrate, wherein the cover surrounds the MEMS motor, wherein the cover and the microphone substrate enclose a back volume, and wherein the MEMS motor is mounted to the first surface of the microphone substrate and the leakage pathway provides a path from the first port to the back volume.

2. The microphone of claim 1, wherein the leakage pathway comprises a slot in the first surface of the microphone substrate, and wherein the slot extends from an outside edge of the MEMS substrate to the first port.

3. The microphone of claim 1, wherein the first surface of the microphone substrate comprises a plurality of slots that extend at least partially into the microphone substrate.

4. The microphone of claim 1, further comprising processing circuitry that is operatively coupled to the MEMS motor, wherein the processing circuitry is configured to monitor a capacitance between the backplate and the diaphragm and output a signal indicative of acoustic energy that passes through the first port and a second port based on the capacitance between the backplate and the diaphragm.

5. The microphone of claim 1, wherein the first port of the MEMS motor aligns with a second port that extends through the microphone substrate.

6. The microphone of claim 5, wherein the leakage pathway comprises a cavity that extends through an interior of the microphone substrate from the second port to a portion of the first surface of the microphone substrate outside of a width of the MEMS motor.

7. The microphone of claim 1, wherein the leakage pathway maintains an aspect ratio between the width of the leakage pathway and the length of the leakage pathway at or below 0.25.

* * * * *